US006239734B1

(12) United States Patent
Bae et al.

(10) Patent No.: US 6,239,734 B1
(45) Date of Patent: May 29, 2001

(54) APPARATUS AND A METHOD FOR ANALOG TO DIGITAL CONVERSION USING PLURAL REFERENCE SIGNALS AND COMPARATORS

(75) Inventors: Jong Hong Bae; Mun Weon Ahn, both of Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/223,387

(22) Filed: Dec. 30, 1998

(30) Foreign Application Priority Data

Dec. 30, 1997 (KR) .................................................. 97-77854

(51) Int. Cl.[7] ...................................................... H03M 1/34
(52) U.S. Cl. ........................................... 341/164; 341/163
(58) Field of Search .................................. 341/164, 155, 341/120, 161, 163

(56) References Cited

U.S. PATENT DOCUMENTS

| 5,426,431 | 6/1995 | Ryu . | |
|---|---|---|---|
| 5,579,005 | 11/1996 | Moroni . | |
| 5,661,483 | 8/1997 | Negahban et al. . | |
| 5,691,722 | * 11/1997 | Wang | ................................... 341/161 |
| 5,764,024 | 6/1998 | Wilson . | |
| 5,764,175 | * 6/1998 | Pan | ...................................... 341/161 |
| 5,861,832 | * 1/1999 | Nagaraj | ................................. 341/161 |
| 5,870,052 | * 2/1999 | Dedic et al. | .......................... 341/161 |

FOREIGN PATENT DOCUMENTS

| 59-86328 | 5/1984 | (JP) . |
|---|---|---|
| 59196619 | 11/1984 | (JP) . |
| 2-191043 | 7/1990 | (JP) . |
| 7-183808 | 7/1995 | (JP) . |

* cited by examiner

*Primary Examiner*—Patrick Wamsley
(74) *Attorney, Agent, or Firm*—Jacobson, Price, Holman & Stern, PLLC

(57) ABSTRACT

An analog-to-digital converter is provided. The analog-to-digital converter capable of increasing the processing speed of the converter by using a number of SAR registers. The analog-to-digital converter, includes: a storage circuit for storing a first, a second and a third digital signals, respectively; a controller for controlling conversions of two bits contained in one of the digital signals stored at the storing means in response to a first, a second and a third comparing signals; a circuit, having a first, a second and a third digital-to-analog converters, for converting the first, the second and the third digital signals by using each of the digital-to-analog converters to provide a first, a second and a third analog reference signals; and a comparator for comparing each of the analog reference signals to an analog input signal which is to be converted, to provide said first, said second and said third comparing signals, and having a first, a second and a third comparators each of which performs each of the comparisons.

11 Claims, 4 Drawing Sheets

ANALOG INPUT SIGNAL

ANALOG INPUT SIGNAL

APPARATUS AND A METHOD FOR ANALOG TO DIGITAL CONVERSION USING PLURAL REFERENCE SIGNALS AND COMPARATORS

BACKGROUND OF THE INVENTION

1. Technical Field

This invention relates to an analog-to-digital converting apparatus and an analog-to-digital converting method. The analog-to-digital converting apparatus compares an analog input signal to a number of reference voltages to provide digital values.

2. Description of the Related Arts

FIG. 1 shows a simple and fast flash type of analog-to-digital converter. The analog-to-digital converter comprises a voltage generator 10 for generating a number of reference voltages, and a comparing unit 12 for comparing an analog input signal to each of the reference voltages. The voltage generator 10 includes a number of registers serially coupled between a voltage source and the ground. The voltage applied at each node of the registers is provided to the comparing unit 12 as the reference voltages. The comparing unit 12 includes a number of comparators (COM). Each of the comparators receives each reference voltage of the voltage generator 10 at a positive terminal (+) and receives the analog signal at a negative terminal (−). After receiving, each of the comparators compares the voltage of the input signal to each of the reference voltages. In case that the voltage of the input signal is greater than one of the reference voltages, one of the comparators outputs "1" signal, otherwise, the comparator outputs "0" signal.

The flash type of N-bit analog-to-digital converter generates the reference voltages by using $2^N$ registers. Each outcome of the comparisons between each of the reference voltages and the analog input signal is outputted by using $(2^{N-1}-1)$ number of the comparators. The output signal is performed by a priority decoding which provides the final digital signal corresponding to the analog input.

The flash type of analog-to-digital converter is capable of converting an analog signal to a digital signal at one time however, it increases the complexity of the hardware. In order to decrease the complexity of the hardware, a SAR (Successive Approximation Register) type of analog-to-digital converter is suggested. FIG. 2 is the SAR type of analog-to-digital converter. The SAR type of the analog-to-digital converter comprises a comparator 20, a digital-to-analog converter 21 and a converting controller 22 which has a special register (SAR) 24 and a controller 23 for controlling the SAR 24.

FIG. 3 shows the total converting algorithm of the SAR type of analog-to-digital converter. First, in step 30, a parameter I for counting the bits of the SAR register 24 is set to "1", and then SAR[1:N] is set to "0". In step 32, I bits of the SAR register 24 is set to "1" (SAR=1000 . . . 000). In step 34, when the value of the SAR register 24 is converted from the digital to the analog, the analog value of the SAR register 24 is compared to the analog input signal. In step 36, if the analog input signal is less than the analog value of the SAR register, the I-bit of the SAR register is cleared to "0" (SAR=0000 . . . 000). If the analog input signal is larger than or equal to the analog value of the SAR register in step 34, the value of the SAR register is not changed and step 34 is going to a step 38. In step 38, the parameter I is compared to another parameter N indicating the value of the SAR register 24, wherein if the parameter I is larger than or equal to the parameter N, the process is ended, otherwise the process is going to step 32. In this point, in case that the analog input signal is lager than or equal to the SAR register 24, the comparator 20 outputs "1". Otherwise, in case that the analog input signal is less than the SAR register 24, the comparator 20 outputs "0". This process is continued to the Nth bit during N cycles, and then the final stored value of the SAR register 24 is the final converted value of the analog-to-digital conversion.

FIG. 4 shows an example operation of 6-bit SAR analog-to-digital converter. There is shown the change of the value of the SAR register corresponding to the converting cycles in case that the analog input signal is 110011. The output signal of the comparator 20 from the first to the sixth cycle is changed as follows: "1"→"1"→"0"→"0"→"1"→"1". And the value of the SAR register 24 is changed as follows: "100000"→"110000"→"110000"→"110000"→"110010"→"110011".

Detailed descriptions of above changes are as follows. In step 30, the parameter I is set to "1". After initializing the SAR register 24, in step 32, the value of the SAR register is set to "100000". In step 34, since the value of the analog input signal "110011" is lager than the value of the SAR register "100000", the value of the SAR register is not changed. In step 38 and step 39, since the parameter I is "1" and the value of N is "6", the value of I is changed to "2" and the process is going to step 32. In step 32, the value of the SAR register is set to "110000". In step 34, since the value of the analog input signal "110011" is lager than the value of the SAR register "110000", the value of the SAR register is not changed. In step 38 and step 39, since the parameter I is "2" and the value of N is "6", the value of I is changed to "3" and the process is going to step 32. In step 32, the value of the SAR register is set to "111000". In step 34, since the value of the analog input signal "110011" is less than the value of the SAR register "111000", SAR[3] is cleared to zero. Therefore, the value of the SAR register is changed to "110000". In step 38 and step 39, since the parameter I is "3" and the value of N is "6", the value of I is changed to "4" and the process is going to step 32. In step 32, the value of the SAR register is set to "110100". In step 34, since the value of the analog input signal "110011" is less than the value of the SAR register "110100", SAR[4] is cleared to zero. Therefore, the value of the SAR register is changed to "110000". In step 38 and step 39, since the parameter I is "4" and the value of N is "6", the value of I is changed to "5" and the process is going to step 32. In step 32, the value of the SAR register is set to "110010". In step 34, since the value of the analog input signal "110011" is lager than the value of the SAR register "110010", the value of the SAR register is not changed. In step 38 and step 39, since the parameter I is "5" and the value of N is "6", the value of I is changed to "6" and the process is going to step 32. In step 32, the value of the SAR register is set to "110011". In step 34, since the value of the analog input signal "110011" is equal to the value of the SAR register "110011", the value of the SAR register is not changed. In step 38 and step 39, since the parameter I is "6" and the value of N is "6", the process is ended.

In the prior art, since the analog-to-digital converter employs only one comparator, the converting time requires N cycles so that the processing speed of the converter is decreased.

SUMMARY OF THE INVENTION

Therefore, the present invention is to provide an analog-to-digital converter capable of increasing the processing speed of the converter by using a number of SAR registers.

According to the present invention, the analog-to-digital converter, comprises: means for storing a first, a second and a third digital signals, respectively; means for controlling conversions of two bits contained in one of the digital signals stored at the storing means in response to a first, a second and a third comparing signals; means, having a first, a second and a third digital-to-analog converters, for converting the first, the second and the third digital signals by using each of the digital-to-analog converters to provide a first, a second and a third analog reference signals; and means for comparing each of the analog reference signals to an analog input signal which is to be converted, to provide said first, said second and said third comparing signals, and having a first, a second and a third comparators each of which performs each of the comparisons.

On the other hand, the method of converting an analog signal to digital signal by an analog-to-digital converter which comprises: means for storing a first, a second and a third digital signals, respectively; means for controlling conversions of two bits contained in one of the digital signals stored at the storing means in response to a first, a second and a third comparing signals; means, having a first, a second and a third digital-to-analog converters, for converting the first, the second and the third digital signals by using each of the digital-to-analog converters to provide a first, a second and a third analog reference signals; and means for comparing each of the analog reference signals to an analog input signal which is to be converted, to provide said first, said second and said third comparing signals, and having a first, a second and a third comparators each of which performs each of the comparisons, comprising steps of: setting a first parameter to "1" and initializing the first, the second, and the third storing means to "0"; first assigning both a bit contained at said first storing means corresponding to the first parameter and a bit contained at said first storing means corresponding to the first parameter plus one to "11", both a bit contained at said second storing means corresponding to the first parameter and a bit contained at said second storing means corresponding to the first parameter plus one to "10", and both a bit contained at said third storing means corresponding to the first parameter and a bit contained at said third storing means corresponding to the first parameter plus one to "01"; converting digital values stored at the first, the second and third storing means to the first, the second and the third analog reference signals and comparing each of the analog reference signals to said analog input signal to provide the first, the second and the third comparing signal; second assigning both a bit contained at the first, the second and the third storing means corresponding to the first parameter and a bit contained at the first, the second and the third storing means corresponding to the first parameter plus one to "00" in case that a combination of the first, the second and the third comparing signals is "000", both a bit contained at the first, the second and the third storing means corresponding to the first parameter and a bit contained at the first, the second and the third storing means corresponding to the first parameter plus one to "01" in case that a combination of the first, the second and the third comparing signals is "001", both a bit contained at the first, the second and the third storing means corresponding to the first parameter and a bit contained at the first, the second and the third storing means corresponding to the first parameter plus one to "10" in case that a combination of the first, the second and the third comparing signals is "011", and both a bit contained at the first, the second and the third storing means corresponding to the first parameter and a bit contained at the first, the second and the third storing means corresponding to the first parameter plus one to "11" in case that a combination of the first, the second and the third comparing signals is "111"; comparing the first parameter to N−1; and ending the converting process if the first parameter is larger than or equal to the N−1, or going back to the first assigning step.

These and other features of the present invention are more fully shown and described in the drawings and detailed description of this invention. It is to be understood, however, that the description and drawings are for the purpose of illustration and should not be read in a manner that would unduly limit the scope of this invention.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE INVENTION

Figure 1:
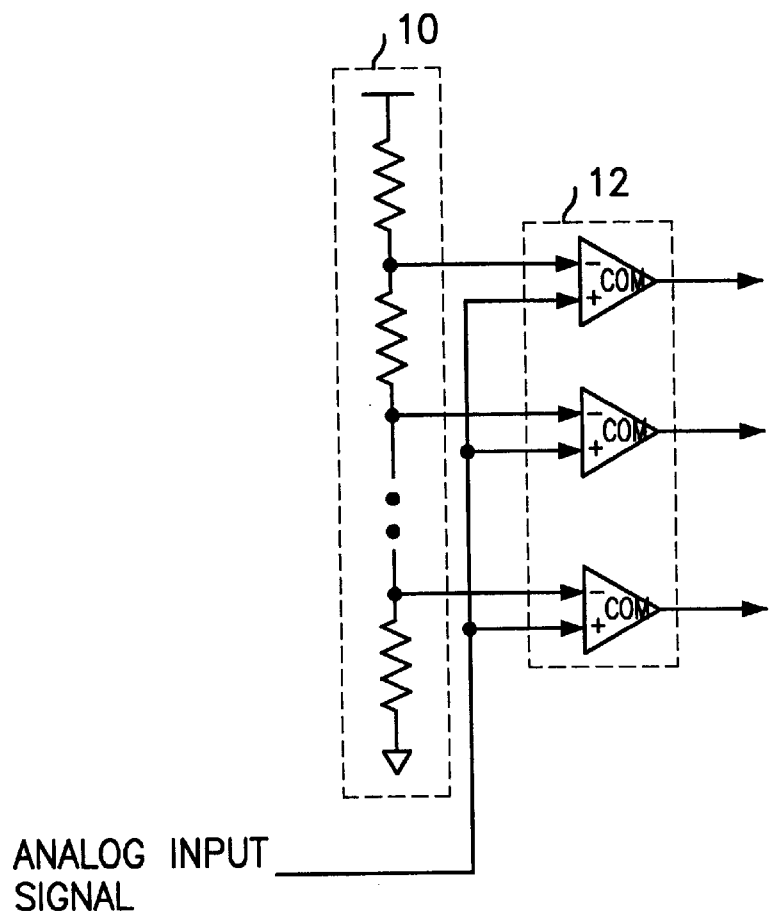
FIG. 1 is a block diagram of a prior art of analog-to-digital converter.
Figure 2:
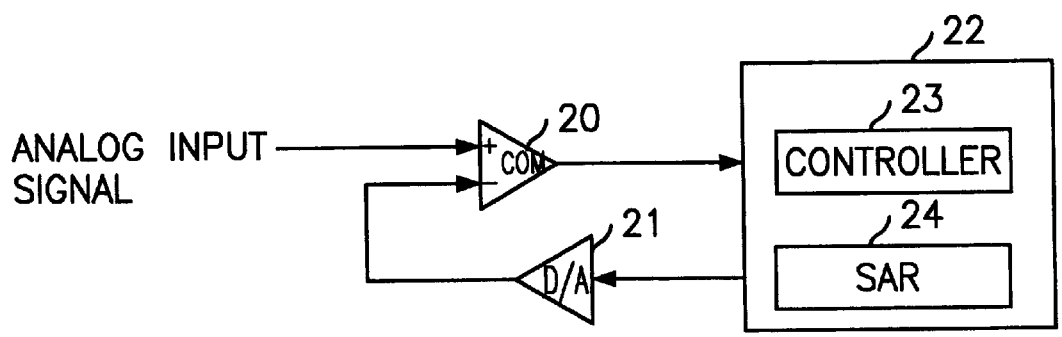
FIG. 2 shows a block diagram of a prior art of SAR type analog-to-digital converter.
Figure 3:
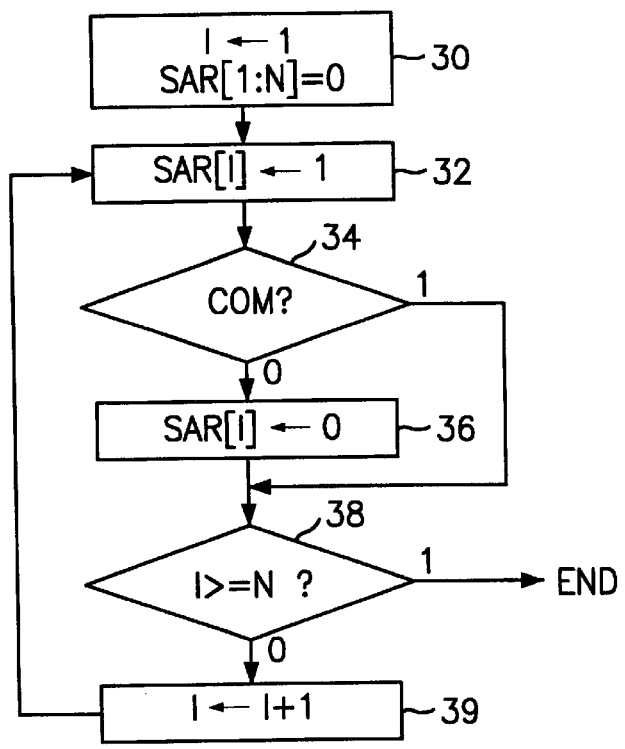
FIG. 3 describes a converting algorithm of the SAR type of analog-to-digital converter of FIG. 2.
Figure 4:
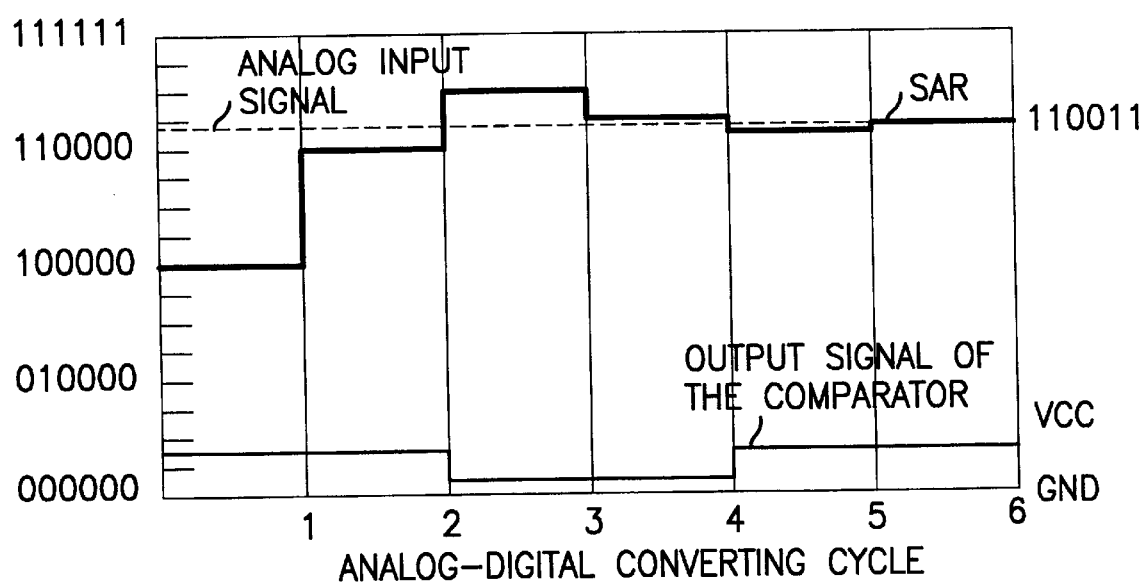
FIG. 4 is a graph of the operation of the SAR type of analog-to-digital converter.
Figure 5:
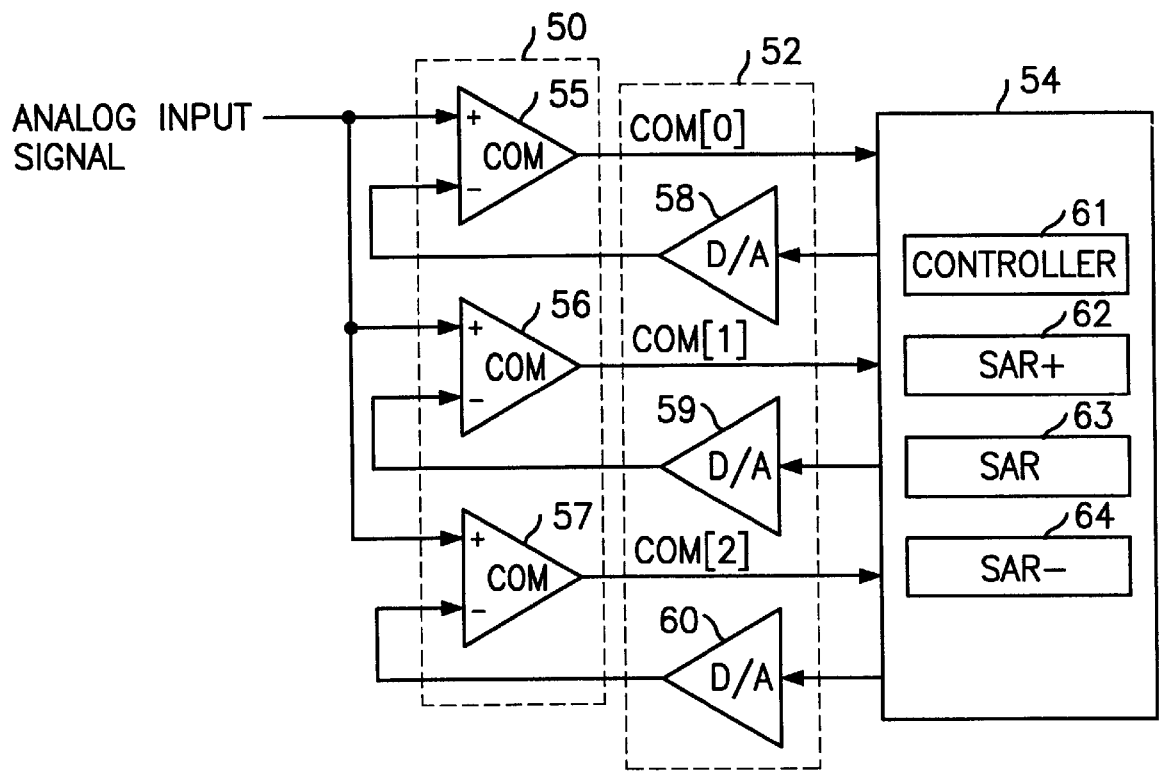
FIG. 5 is a block diagram of an analog-to-digital converter in accordance with the present invention.

FIG. 5 shows a block diagram of an analog-to-digital converter in accordance with the present invention. The converter includes a converting controller 54, a digital-to-analog converting unit 52 and a comparing unit 50. The converting controller has a first special register (SAR+) 62, a second special register (SAR) 63, a third special register (SAR−) 64 and a controller 61 for controlling the SAR registers 62, 63 and 64. The digital-to-analog converting unit 52 has a first, a second and a third digital-to-analog converters 58, 59 and 60 for converting values of the special register 62, 63 and 64 to analog signals. The comparing unit 50 has a first, a second and a third comparators 55, 56 and 57 for comparing an analog input signal to the digital-to-analog converted signals provided from the digital-to-analog converting unit 52.

The analog-to-digital conversion of the converter of FIG. 5 is as follows.

First, each of the digital reference values provided from each of the SAR resisters 62, 63 and 64 is converted to each of analog reference values through each of the digital-to-analog converters 58, 59 and 60. And then, each of the analog reference signals is compared to the analog input signal at each of the comparators 55, 56 and 57. Thereafter, according to each of the comparing result, each value of the SAR registers 62, 63 and 64 is changed. First, two bits from MSB (Most Significant Bit) to LSB (Least Significant Bit) at the SAR register 63 is set to "10", and two bits from MSB to LSB at the SAR+ register 62 is set to "11", and two bits from MSB to LSB at the SAR− register 64 is set to "01".

Thereafter, each value of the SAR registers is compared to the analog input signal. In the comparator 55, if the analog input signal is larger than or equal to the value of the SAR+ register 62, the comparing result signal COM[0] is "1", otherwise, COM[0] is "0". In the comparator 56, if the analog input signal is larger than or equal to the value of the SAR register 63, the comparing result signal COM[1] is "1", otherwise, COM[1] is "0". In the comparator 57, if the analog input signal is larger than or equal to the value of the SAR− register 64, the comparing result signal COM[2] is "1", otherwise, COM[2] is "0". Thereafter, the results of the comparisons are combined to adjust the two bits of the registers 62, 63 and 64 according to a below expression I.
[Expression I]
IF COM[0:2]==000, SAR−[I+1]=SAR[I+1]=SAR+[I+1]= "00"
IF COM[0:2]==001, SAR−[I+1]=SAR[I+1]=SAR+[I+1]= "01"
IF COM[0:2]==011, SAR−[I+1]=SAR[I+1]=SAR+[I+1]= "10"
IF COM[0:2]==111, SAR−[I+1]=SAR[I+1]=SAR+[I+1]= "11"

Figure 6:
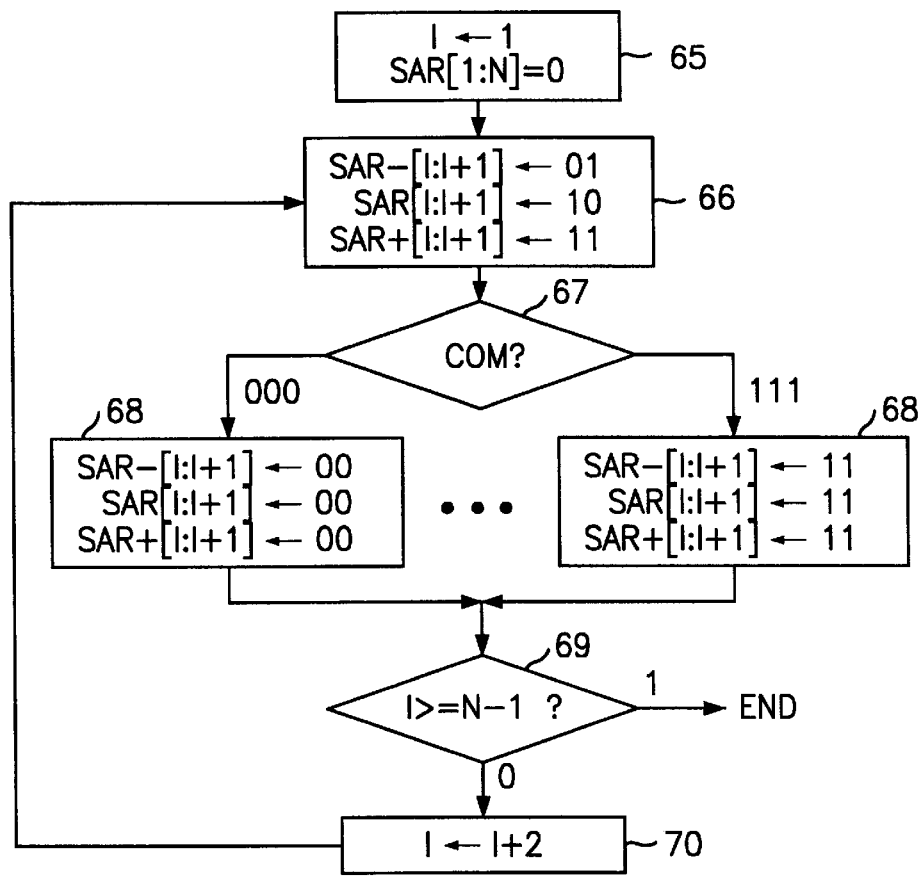
FIG. 6 describes a converting algorithm of the analog-to-digital converter of FIG. 5.

FIG. 6 shows an algorithm of the analog-to-digital converter in accordance with the present invention. The conversion process is as follows.

In step 65, a loop parameter I is set to "1" and SAR−[1:N], SAR[1:N] and SAR+[1:] is initialized. In step 66, two bits of the SAR− register 64, that is I bit and I+1 bit, is set to "01" (SAR−=01000 . . . 000). Two bits of the SAR register 63, that is I bit and I+1 bit, is set to "10" (SAR=1000 . . . 000). Two bits of the SAR+ register 62, that is I bit and I+1 bit, is set to "11" (SAR+=1100 . . . 000). Thereafter, in step 67, when each value of the registers 62, 63 and 64 is converted from the digital to the analog, the analog value of the register 62, 63 and 64 is compared to the analog input signal. After comparing, according to signal combinations, I bit and I+1 bit of the registers 62, 63 and 64 are assigned according to [Expression I]. In step 69, the loop parameter I is compared to another parameter N−1. If the loop parameter I is larger than or equal to the parameter N−1, the process is ended, otherwise, the process is going to step 66 after I is added by 2 in step 70.

Figure 7:
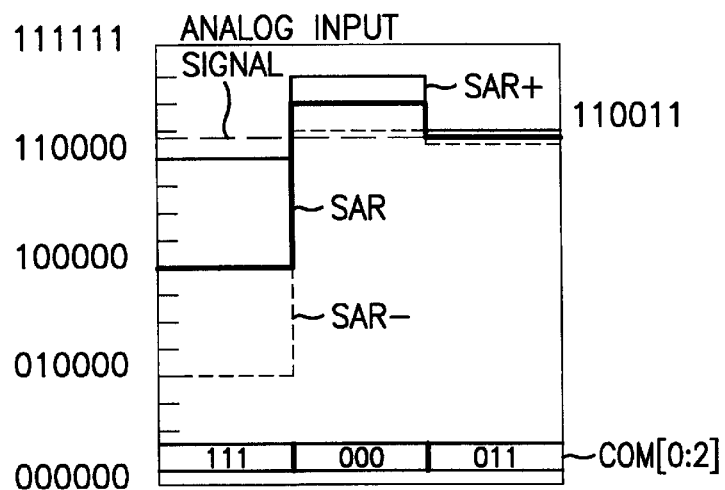
FIG. 7 is a graph of the operation of the analog-to-digital converter of FIG. 5.

FIG. 7 shows an example operation of 6-bit analog-to-digital converter. There is shown the change of the value of the registers corresponding to the converting cycles in case that the analog input signal is 110011. The combination of the output signal of the comparator from a first to a third cycle is changed as follows: "111"→"000"→"011". Therefore, the value of the SAR register 63 is changed as follows: "10000"→"1110000"→"110011".

Detailed descriptions of above changes are as follows. In step 65, the parameter I is set to "1". After initializing registers SAR−[1:6], SAR[1:6] and SAR+[1:6] to "0", in step 66, the value of the SAR−[1:2] is set to "01", and the value of the SAR [1:2] is set to "10", and the value of the SAR+[1:2] is set to "11". At this time, SAR−[1:6] stores a data stream "010000", SAR [1:6] contains a data stream "100000", and SAR+[1:6] has a data stream "110000". In step 67, since the value of the analog input signal "110011" is lager than each value of the registers SAR−[1:6], SAR [1;6] and SAR+[1;6], COM[0:2] becomes "111" so that each value of registers SAR−[1:2], SAR [1;2] and SAR+[1;2] is assigned to "11". In step 69 and step 70, since the loop parameter I is "1" and the value of N is "6", the value of loop parameter I is added by "2" and then the process is feedback to step 66. In step 66, the value of the SAR−[3:4] is set to "01", and the value of the SAR [3:4] is set to "10", and the value of the SAR+[3:4] is set to "11". At this time, SAR−[1:6] stores a data stream "110100", SAR [1:6] contains a data stream "111000", and SAR+[1:6] has a data stream "111100". In step 67, since the value of the analog input signal "110011" is lager than each value of the registers SAR−[1:6], SAR [1;6] and SAR+[1;6], COM[0:2] becomes "000" so that each value of the registers SAR−[1:2], SAR [1;2] and SAR+[1;2] is assigned to "00". In step 69 and step 70, since the loop parameter I is "3" and the value of N is "6", the value of loop parameter I is added by "2" and then the process is feedback to step 66.

In step 66, the value of the SAR−[5:6] is set to "01", and the value of the SAR [5:6] is set to "10", and the value of the SAR+[5:6] is set to "11". At this time, SAR−[1:6] stores a data stream "110001", SAR [1:6] contains a data stream "110010", and SAR+ [1:6] has a data stream "110011". In step 67, since the value of the analog input signal "110011" is lager than each value of the registers SAR− [1:6], SAR [1;6] and SAR+ [1;6], COM[0:2] becomes "111" so that each value of registers SAR− [1:2], SAR [1;2] and SAR+ [1;2] is assigned to "11". In step 69, since the loop parameter I is "5" and the value of N is "6", the process is ended.

Therefore, since the analog-to-digital converter in accordance with the present invention determines two bits of the SAR registers during one cycle, if N bits of analog-to-digital conversion, the conversion is completely performed by an N/2 cycle.

Above described analog-to-digital converter in accordance with the present invention may be required at a design of a micro-controller.

Various modification and alterations of this invention will become apparent to those skilled in the art without departing from the scope and spirit of this invention. It should therefore be understood that this invention is not unduly limited to the illustrative embodiments set forth above, but it to be controlled by the limitations set forth in the claims and equivalents thereof.

What is claimed is:
1. An analog-to-digital converter, comprising:
   a first, a second, and a third special register (SAR) for storing a first, a second and a third digital signal, respectively, each of said first, second and third digital signals having two bits;
   a first, a second and a third digital-to-analog converter (DAC), coupled to said first, second, and third SAR, respectively, for converting the first, the second and the third digital signals to generate a first, a second and a third analog reference signal;
   a first, a second and a third comparator, coupled to an output of said first, second and third DAC, respectively, for comparing the first, second and third analog reference signals, respectively, to an analog input signal which is to be converted, and for respectively generating, from these comparisons, a first, a second and a third comparing signal; and
   means for controlling conversion of the two bits contained in each of the stored digital signals in one cycle in response to the first, the second and the third comparing signals such that N bit analog signals are converted within N/2 cycle.

2. The analog-to-digital converter as claimed in claim 1, wherein each of the comparators generates the comparing signal "1" in case that the analog input signal is larger than or equal to the analog reference signal.

3. The analog-to-digital converter as claimed in claim 2, wherein said conversion controlling means, if a combination of the first, the second and the third comparing signals is "000", for converting said two bits of each of the storing means to "00" which is stored thereat.

4. The analog-to-digital converter as claimed in claim 2, wherein said conversion controlling means, if a combination of the first, the second and the third comparing signals is "001", for converting said two bits of each of the storing means to "01" which is stored thereat.

5. The analog-to-digital converter as claimed in claim 2, wherein said conversion controlling means, if a combination of the first, the second and the third comparing signals is "011", for converting said two bits of each of the storing means to "10" which is stored thereat.

6. The analog-to-digital converter as claimed in claim 2, wherein said conversion controlling means, if a combination of the first, the second and the third comparing signals is "111", for converting said two bits of each of the storing means to "11" which is stored thereat.

7. The analog-to-digital converter as claimed in claim 1, wherein each of the comparators generates the comparing signal "0" in case that the analog input signal is less than the analog reference signal.

8. A method of converting an analog signal to a digital signal comprising the steps of:

a) setting a first parameter to "1" and initializing each of first, second, and third storing means to "0";

b) assigning within the first storing means both a bit corresponding to the first parameter and a bit corresponding to the first parameter plus one to "11";

c) assigning within the second storing means both a bit corresponding to the first parameter and a bit corresponding to the first parameter plus one to "10";

d) assigning within the third storing means both a bit corresponding to the first parameter and a bit corresponding to the first parameter plus one to "01";

e) converting digital values stored at the first, the second and third storing means to first, second and third analog reference signals, respectively;

f) comparing each of the first, second and third analog reference signals to an analog input signal to provide first, second and third comparing signals, respectively, and outputting, for each of the first, second and third comparing signals, a comparing result signal of "1" if the analog input signal is greater than or equal to a respective analog reference signal and a comparing result signal of "0" if the analog input signal is smaller than the respective analog reference signal;

g) combining the first, the second and the third comparing signals;

h) assigning within each of the first, second and third storing means both a bit corresponding to the first parameter and a bit corresponding to the first parameter plus one to "00" in case that a combination of the first, the second and the third comparing signals is "000";

i) assigning within each of the first, the second and third storing means both a bit corresponding to the first parameter and a bit corresponding to the first parameter plus one to "01" in case that a combination of the first, the second and the third comparing signals is "001";

j) assigning within each of the first, the second and the third storing means both a bit corresponding to the first parameter and a bit corresponding to the first parameter plus one to "10" in case that a combination of the first, the second and the third comparing signals is "011";

k) assigning within each of the first, the second and the third storing means both a bit corresponding to the first parameter and a bit corresponding to the first parameter plus one to "11" in case that a combination of the first, the second and the third comparing signals is "111"; and l) comparing the first parameter to N−1;

m) adding 2 to the first parameter in response to the first parameter being smaller than N−1;

n) repeating steps b) through l); and p) ending the converting process in response to the first parameter being greater than or equal to N−1.

9. A method of converting an analog signal to a digital signal comprising the steps of:

a) setting a loop parameter to "1" and initializing each of first, second, and third storing means to "0";

b) assigning two bits within the first storing means to "11", two bits within the second storing means to "10", and two bits within the third storing means to "01";

c) converting digital values stored at the first, the second and third storing means to first, second and third analog reference signals, respectively;

d) comparing each of the first, second and third analog reference signals to an analog input signal to provide first, second and third comparing signals, respectively;

e) combining the first, the second and the third comparing signals;

f) assigning within one cycle two bits within each of the first, the second, and the third storing means to "00" in response to a combination of the first, the second and the third comparing signals being "000";

g) assigning within one cycle two bits within each of the first, the second, and the third storing means to "01" in response to a combination of the first, the second and the third comparing signals being "001";

h) assigning within one cycle two bits within each of the first, the second, and the third storing means to "10" in response to a combination of the first, the second and the third comparing signals being "011"; and i) assigning within one cycle two bits within each of the first, the second, and the third storing means to "11" in response to a combination of the first, the second and the third comparing signals being "111".

10. The method as set forth in claim 9, the d) comparing step comprising the steps of:

outputting a comparing result signal of "1" if the analog input signal is larger than or equal to the respective analog reference signal;

outputting a comparing result signal of "0" if the analog output signal is smaller than the respective analog reference signal.

11. The method as set forth in claim 9, wherein the two bits in each storing means correspond to the loop parameter and the loop parameter plus one.

\* \* \* \* \*